(12) United States Patent
Kurakawa

(10) Patent No.: US 7,900,514 B2
(45) Date of Patent: Mar. 8, 2011

(54) TUNING-FORK-TYPE BIMORPH PIEZOELECTRIC VIBRATOR AND VIBRATING GYROSCOPE MODULE INCLUDING THE VIBRATOR

(75) Inventor: Haruyoshi Kurakawa, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 16 days.

(21) Appl. No.: 12/212,772

(22) Filed: Sep. 18, 2008

(65) Prior Publication Data

US 2009/0007665 A1 Jan. 8, 2009

Related U.S. Application Data

(63) Continuation of application No. PCT/JP2006/317324, filed on Sep. 1, 2006.

(30) Foreign Application Priority Data

Apr. 26, 2006 (JP) .................................. 2006-122325

(51) Int. Cl.
*G01P 9/04* (2006.01)
(52) U.S. Cl. ..................................... 73/504.16; 310/370
(58) Field of Classification Search ................ 73/504.16; 310/329, 348, 370
See application file for complete search history.

(56) References Cited

U.S. PATENT DOCUMENTS 5,794,080 A 8/1998 Watanabe et al.
6,799,461 B2 * 10/2004 Fujimoto et al. ........... 73/504.16

FOREIGN PATENT DOCUMENTS

JP 2000-258164 A 9/2000
JP 2005-172542 A 6/2005

OTHER PUBLICATIONS

Official Communication issued in International Patent Application No. PCT/JP2006/317324, mailed on Nov. 7, 2006.

* cited by examiner

*Primary Examiner* — John E Chapman
(74) *Attorney, Agent, or Firm* — Keating & Bennett, LLP

(57) ABSTRACT

A tuning-fork-type bimorph piezoelectric vibrator includes two piezoelectric bodies that are bonded together and have opposite polarization directions. An intermediate metal layer is disposed between bonding surfaces of the piezoelectric bodies. A first slit is arranged to define legs and a base of the tuning fork structure. Second slits are provided in a first principal surface having a front metal layer to define driving/detecting electrodes. The tuning-fork-type bimorph piezoelectric vibrator provides improved temperature characteristics of a detuning frequency by not including a back metal layer on a second principal surface at least in an area in which greater than a predetermined level of stress is applied during operation.

11 Claims, 6 Drawing Sheets

FRONT SIDE OF VIBRATOR (FIRST PRINCIPAL SURFACE)

BACK SIDE OF VIBRATOR (SECOND PRINCIPAL SURFACE)

CROSS SECTION OF VIBRATOR LEGS

CROSS SECTION OF VIBRATOR BASE

FREQUENCY CHANGES (WITH BACK METAL LAYER)

FREQUENCY CHANGES (WITHOUT BACK METAL LAYER)

TEMPERATURE CHARACTERISTICS OF DETUNING FREQUENCY

AMOUNT OF DETUNING FREQUENCY CHANGE

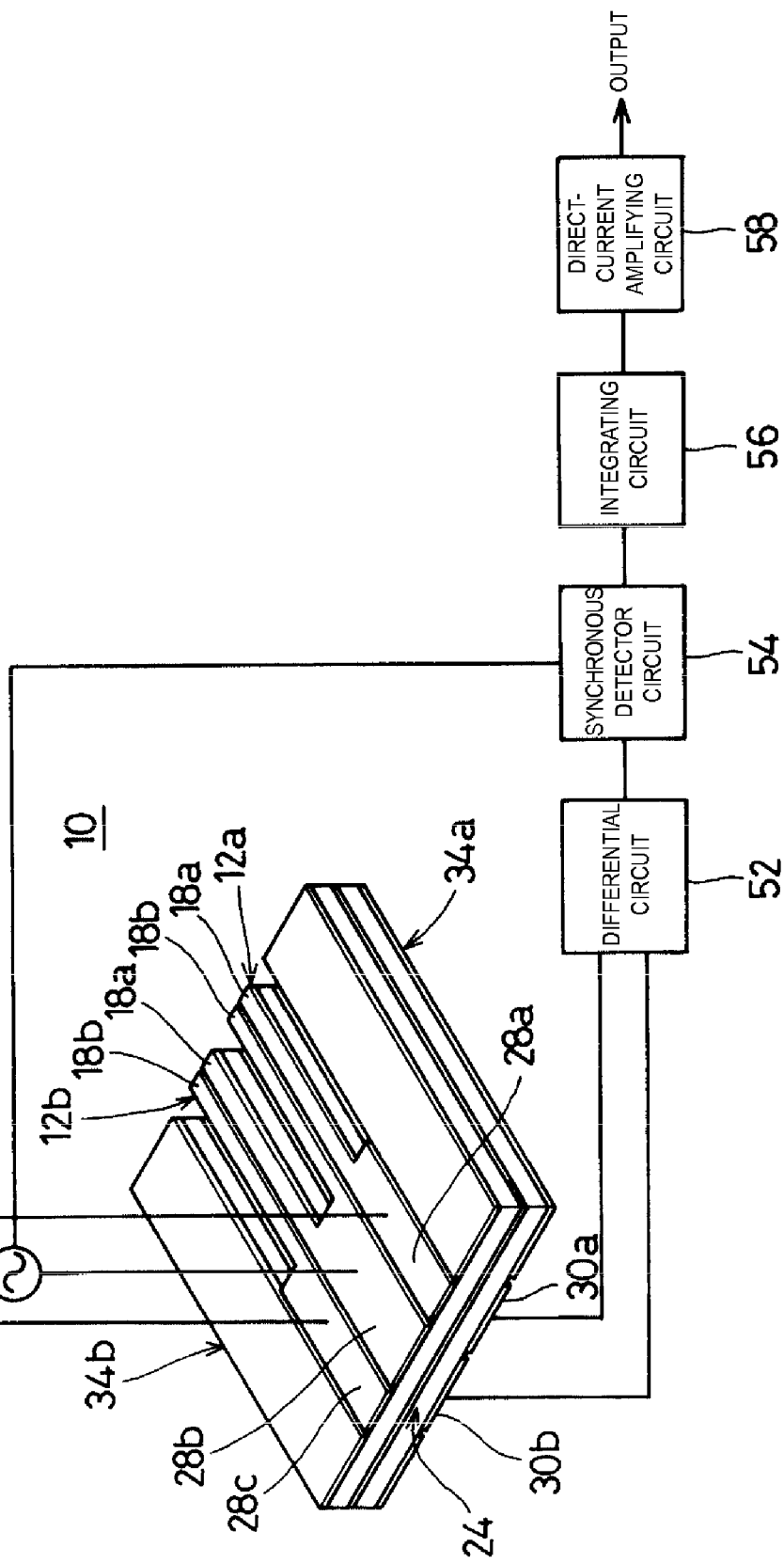

TUNING-FORK-TYPE BIMORPH PIEZOELECTRIC VIBRATOR AND VIBRATING GYROSCOPE MODULE INCLUDING THE VIBRATOR

BACKGROUND OF THE INVENTION

1. Field of the Invention

The present invention relates to piezoelectric vibrators, and particularly, to a tuning-fork-type bimorph piezoelectric vibrator including two piezoelectric bodies having opposite polarization directions bonded together to define a tuning fork structure.

2. Description of the Related Art

In recent years, vibrating gyroscopes have been widely used as rotational angle detectors for car navigation and image stabilizers to prevent motion blur in digital still cameras and digital video cameras.

Examples of vibrators included in such vibrating gyroscopes include a tuning-fork-type bimorph piezoelectric vibrator illustrated in FIG. 7 (see, e.g., Japanese Unexamined Patent Application Publication No. 2000-258164).

The conventional tuning-fork-type bimorph piezoelectric vibrator 10 is formed by bonding first and second piezoelectric bodies having opposite polarization directions together to define a tuning fork structure. A driving electrode 28b including two separate portions is arranged on a first principal surface defined by a surface of the first piezoelectric bodies. An alternating voltage is applied to the driving electrode 28b and causes fundamental vibrations in which legs 12a and 12b at an end of the vibrator are opened and closed from side to side. Then, when a rotational angular velocity is externally applied, the Coriolis force causes the legs 12a and 12b to vibrate in a bending mode in directions that are opposite to each other and substantially perpendicular to the directions of the fundamental vibrations. Then, an electric charge generated in the first piezoelectric body by the bending vibrations of the legs 12a and 12b is extracted from detecting electrodes 30a and 30b on a second principal surface defined by a surface of the second piezoelectric body. The extracted electric charge is differential-amplified, and thus, a rotational angular velocity can be detected.

Here, a difference between a resonance frequency of a driving system and that of a detecting system is referred to as detuning frequency. As the detuning frequency decreases, detection sensitivity increases, but responsiveness decreases. Therefore, the detuning frequency is appropriately set such that a desired detection sensitivity can be achieved within a desired range of detection.

However, in a conventional tuning-fork-type bimorph piezoelectric vibrator, such as the tuning-fork-type bimorph piezoelectric vibrator described above, a detuning frequency changes significantly with temperature. This causes significant changes in the detection sensitivity and makes it difficult to accurately determine a rotational angular velocity.

Moreover, since the detuning frequency changes significantly with temperature, adjustment of the detuning frequency is time consuming and failure to adjust the detuning frequency may cause defects in the vibrator.

Additionally, since it is necessary to connect the detecting electrodes to external circuits, problems such as increased cost and variations in characteristics occur.

SUMMARY OF THE INVENTION

To overcome the problems described above, preferred embodiments of the present invention provide a tuning-fork-type bimorph piezoelectric vibrator that provides improved temperature characteristics of a detuning frequency and that is capable of stably detecting a rotational angular velocity with high accuracy and at low cost.

A tuning-fork-type bimorph piezoelectric vibrator according to a preferred embodiment of the present invention includes two piezoelectric bodies having opposite polarization directions and bonded together to define a tuning fork structure. In the tuning-fork-type bimorph piezoelectric vibrator, driving/detecting electrodes are arranged on a first principal surface defined by a surface of one of the two piezoelectric bodies bonded together, an intermediate metal layer is disposed between the bonding surfaces of the two piezoelectric bodies, and no metal layer is provided on a second principal surface defined by a surface of the other of the two piezoelectric bodies.

A tuning-fork-type bimorph piezoelectric vibrator according to another preferred embodiment of the present invention includes two piezoelectric bodies having opposite polarization directions and bonded together to define a tuning fork structure, wherein driving/detecting electrodes are arranged on a first principal surface defined by a surface of one of the two piezoelectric bodies, an intermediate metal layer is disposed between bonding surfaces of the two piezoelectric bodies, and a back metal layer is arranged on only a portion of a second principal surface defined by a surface of the other of the two piezoelectric bodies, the portion being subjected to no more than a predetermined level of stress during the operation of the tuning-fork-type bimorph piezoelectric vibrator.

Preferably, the back metal layer is arranged on at least one of an end portion of legs of the tuning fork structure and an end portion of a base of the tuning fork structure, for example.

In the tuning-fork-type bimorph piezoelectric vibrator according to preferred embodiments of the present invention, a first slit and second slits are preferably provided. The first slit is arranged to extend in a longitudinal direction of the vibrator defined by the two piezoelectric bodies, and to partially divide the vibrator into right and left substantially symmetrical portions in a width direction of the vibrator, to thereby define legs of the tuning fork structure. The second slits preferably extend in a longitudinal direction to divide a metal layer arranged on the first principal surface into the driving/detecting electrodes.

A vibrating gyroscope module according to a preferred embodiment of the present invention includes a tuning-fork-type bimorph piezoelectric vibrator according to a preferred embodiment of the present invention arranged to detect a rotational angular velocity. The vibrating gyroscope module includes a supporting substrate on which a driving/detecting circuit is arranged to drive the tuning-fork-type bimorph piezoelectric vibrator in order to detect a rotational angular velocity and a wiring electrode arranged to be connected to the driving/detecting electrodes of the tuning-fork-type bimorph piezoelectric vibrator, and a support arranged to support the tuning-fork-type bimorph piezoelectric vibrator on the supporting surface such that a vibration actuator of the tuning-fork-type bimorph piezoelectric vibrator is supported and spaced away from the supporting surface.

Preferably, the wiring electrode on the supporting substrate is arranged opposite to the driving/detecting electrodes in the base of the tuning-fork-type bimorph piezoelectric vibrator, for example.

Preferably, the support bonds the driving/detecting electrodes in the base of the tuning-fork-type bimorph piezoelectric vibrator to the wiring electrode on the supporting substrate with a conductive material, for example, to thereby support the vibration actuator of the tuning-fork-type bimorph piezoelectric vibrator so as to be spaced from the supporting substrate and to establish an electrical connection between the driving/detecting electrodes and the wiring electrode.

A method for manufacturing a tuning-fork-type bimorph piezoelectric vibrator according to a preferred embodiment of the present invention includes the steps of bonding a first piezoelectric body polarized in a thickness direction thereof and having a metal layer formed on a front surface thereof and a second piezoelectric body polarized in a thickness direction thereof and having a metal layer formed on a back surface thereof together such that a polarization direction of the two piezoelectric bodies are opposite to each other, to thereby produce a master substrate in which an intermediate metal layer is disposed between bonding surfaces of the piezoelectric bodies and a front metal layer is arranged on a first principal surface defined by a surface of one of the two piezoelectric bodies; cutting the master substrate at predetermined intervals to form cutout blocks; forming first slits at predetermined intervals in the cutout blocks, each first slit extending in a longitudinal direction of the cutout blocks and partially dividing the cutout blocks into right and left substantially symmetrical portions in a width direction, to define a tuning fork structure having two legs divided by the first slit; forming second slits along the longitudinal direction and in the first principal surface of each of the cutout blocks in which the legs of the tuning fork structure are formed, the second slits having a depth less than a thickness of the one piezoelectric body on which the front metal layer is formed, thereby dividing the front metal layer into driving/detecting electrodes; and separating the cutout blocks having the driving/detecting electrodes by cutting along lines, wherein each of the lines is located substantially at a center between adjacent first slits and being substantially parallel to the first slits.

A method for manufacturing a tuning-fork-type bimorph piezoelectric vibrator according to another preferred embodiment of the present invention includes the steps of bonding a first piezoelectric body polarized in a thickness direction thereof and having metal layers formed on front and back surfaces thereof and a second piezoelectric body polarized in a thickness direction thereof together such that polarization directions of the two piezoelectric bodies are opposite to each other, to thereby produce a master substrate in which an intermediate metal layer is disposed between bonding surfaces of the two piezoelectric bodies and a front metal layer is arranged on a first principal surface defined by a surface of one of the two piezoelectric bodies; cutting the master substrate at predetermined intervals to form cutout blocks; forming first slits at predetermined intervals in the cutout blocks, each first slit extending in a longitudinal direction of the cutout blocks and partially dividing the cutout blocks into right and left substantially symmetrical portions in a width direction, to define a tuning fork structure having two legs divided by the first slit; forming second slits along the longitudinal direction of the cutout blocks and in the first principal surface of each of the cutout blocks in which the legs of the tuning fork structure are formed, the second slits having a depth less than a thickness of the one piezoelectric body on which the front metal layer is formed, to thereby divide the front metal layer into driving/detecting electrodes; and separating the cutout blocks having the driving/detecting electrodes by cutting along lines, each line being located substantially at a center between adjacent first slits and being substantially parallel to the first slits.

A method for manufacturing a tuning-fork-type bimorph piezoelectric vibrator according to another preferred embodiment of the present invention includes the steps of bonding a first piezoelectric body polarized in a thickness direction thereof and having metal layers formed on front and back surfaces thereof and a second piezoelectric body polarized in a thickness direction thereof and having a metal layer formed on a back surface thereof together such that the polarization directions of the two piezoelectric bodies are opposite each other, to thereby produce a master substrate in which an intermediate metal layer is disposed between bonding surfaces of the two piezoelectric bodies, a front metal layer is arranged on a first principal surface defined by a surface of one of the two piezoelectric bodies, and a back metal layer is arranged on a second principal surface defined by a surface of the other of the two piezoelectric bodies; removing a portion of the back metal layer from the second principal surface of the master substrate, the portion being subjected to greater than a predetermined level of stress during operation; cutting the master substrate at predetermined intervals to form cutout blocks; forming first slits at predetermined intervals in the cutout blocks, each first slit extending in a longitudinal direction of the cutout blocks and partially dividing the cutout blocks into right and left substantially symmetrical portions in a width direction, to define a tuning fork structure having two legs divided by the first slit; forming second slits along the longitudinal direction and in the first principal surface of each of the cutout blocks in which the legs of the tuning fork structure are formed, the second slits having a depth less than a thickness of the one piezoelectric body on which the front metal layer is formed, thereby dividing the front metal layer into driving/detecting electrodes; and separating the cutout blocks having the driving/detecting electrodes by cutting along lines, each line being located substantially at a center between adjacent first slits and being substantially parallel to the first slits.

In the step of removing, the portion of the back metal layer may preferably be removed by grinding, for example.

Alternatively, in the step of removing, the portion of the back metal layer may preferably be removed by etching, for example.

Preferred embodiments of the present invention provide improved temperature characteristics of a detuning frequency and stable detection of a rotational angular velocity with high accuracy and at low cost.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 7 is a schematic block diagram illustrating a vibrating gyroscope including a conventional tuning-fork-type bimorph piezoelectric vibrator.

DETAILED DESCRIPTION OF PREFERRED EMBODIMENTS

Figure 1A:
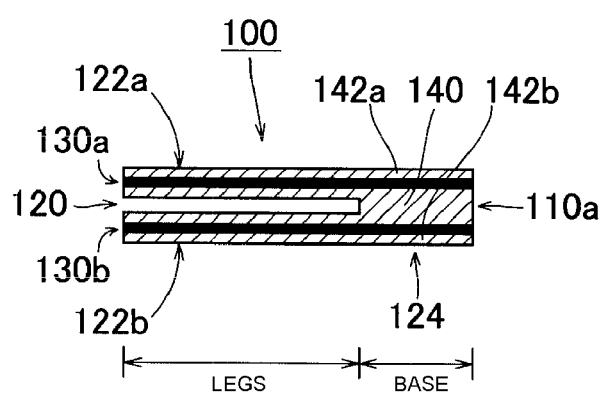
FIGS. 1A to 1D schematically illustrate a tuning-fork-type bimorph piezoelectric vibrator having no back metal layer according to a preferred embodiment of the present invention.
Figure 1B:
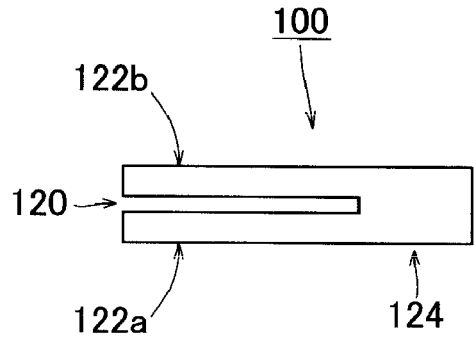
Figure 1C:
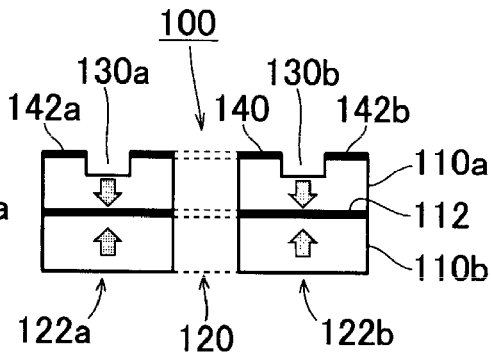
Figure 1D:
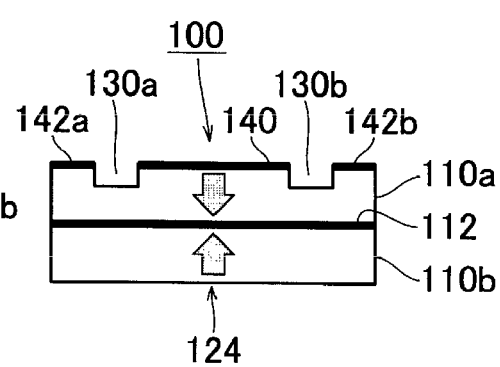

FIGS. 1A to 1D schematically illustrate a tuning-fork-type bimorph piezoelectric vibrator according to a preferred embodiment of the present invention. FIG. 1A illustrates a front surface (first principal surface) of a tuning-fork-type bimorph piezoelectric vibrator 100. FIG. 1B illustrates a back surface (second principal surface) of the tuning-fork-type bimorph piezoelectric vibrator 100. FIG. 1C illustrates a cross section of legs of the tuning-fork-type bimorph piezoelectric vibrator 100. FIG. 1D illustrates a cross section of a base of the tuning-fork-type bimorph piezoelectric vibrator 100.

The tuning-fork-type bimorph piezoelectric vibrator 100 of the present preferred embodiment is a long bimorph piezoelectric vibrator including two long piezoelectric bodies 110a and 110b that are bonded together with epoxy resin or other suitable bonding material. The piezoelectric bodies 110a and 110b are polarized in their thickness direction and bonded together such that their polarization directions are opposite to each other. An intermediate metal layer 112 is disposed between the bonding surfaces of the piezoelectric bodies 110a and 110b. Arrows shown in FIGS. 1C and 1D indicate polarization directions of the respective piezoelectric bodies. The polarization directions may extend either towards or away from each other.

The long bimorph piezoelectric vibrator having the intermediate metal layer is provided with a first slit 120 which extends in the longitudinal direction to partially divide the vibrator into right and left substantially symmetrical portions in the width direction. Thus, a tuning-fork-type piezoelectric vibrator having two legs 122a and 122b and a base 124 is provided.

Additionally, the first principal surface of the tuning-fork-type piezoelectric vibrator includes a metal layer arranged thereon, and second slits 130a and 130b extending along the longitudinal direction to divide the metal layer. Thus, driving/detecting electrodes 140, 142a, and 142b are provided.

In this preferred embodiment, the first slit is preferably provided in the long piezoelectric vibrator to provide the tuning-fork-type piezoelectric vibrator, and the second slits are preferably provided in the first principal surface of the tuning-fork-type piezoelectric vibrator to provide the driving/detecting electrodes, for example. However, the tuning-fork-type bimorph piezoelectric vibrator of the present preferred embodiment may be formed in any suitable manner, as long as it includes two piezoelectric bodies having opposite polarization directions that are bonded together to have a tuning fork structure, an intermediate metal layer disposed between bonding surfaces of the piezoelectric bodies, driving/detecting electrodes provided in the first principal surface, and no back metal layer provided on the second principal surface.

Figure 2:
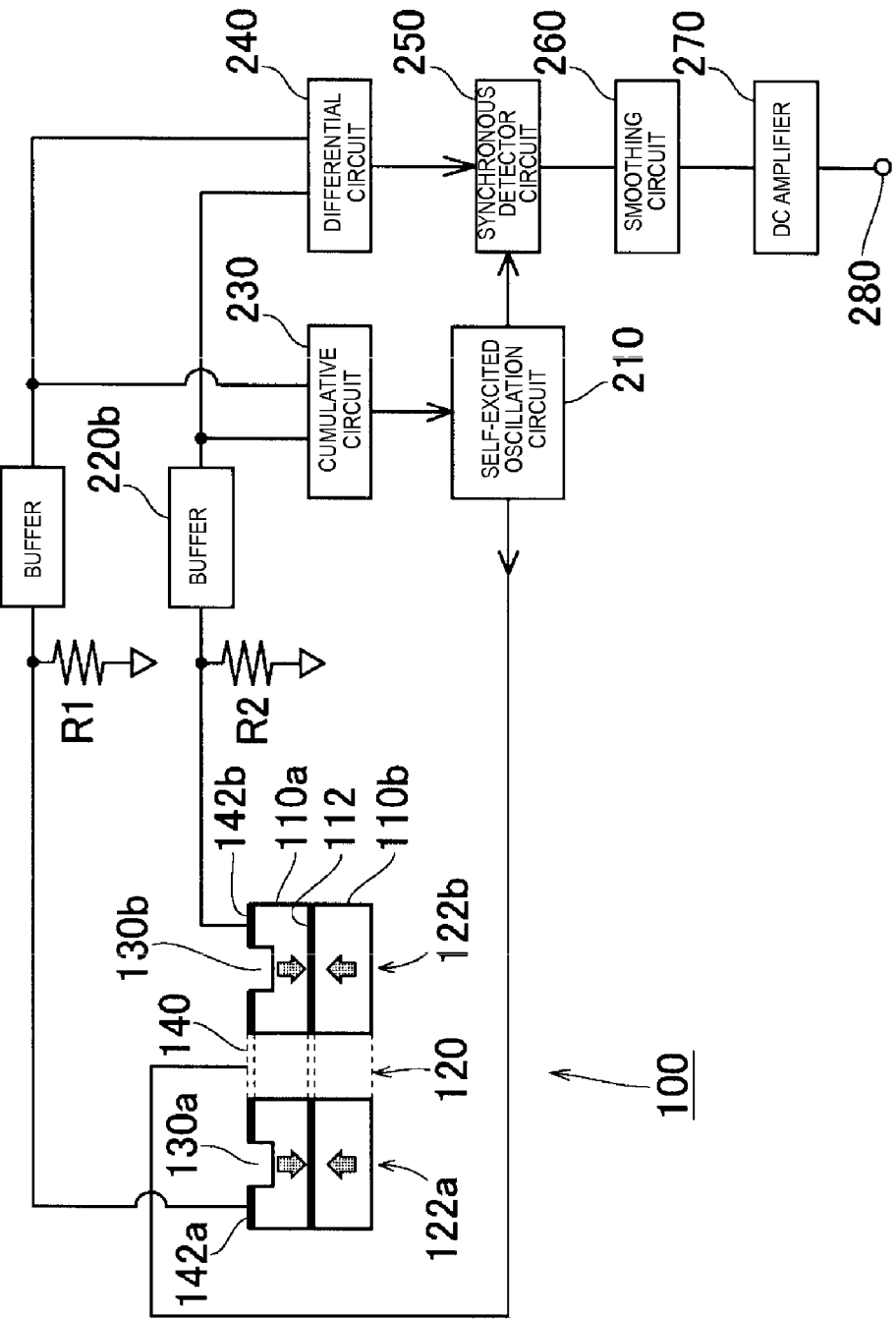
FIG. 2 is a circuit diagram of a vibrating gyroscope including a tuning-fork-type bimorph piezoelectric vibrator according to a preferred embodiment of the present invention.

FIG. 2 is a circuit diagram of a vibrating gyroscope including the tuning-fork-type bimorph piezoelectric vibrator 100. As illustrated in FIG. 2, in a vibrating gyroscope 200, the inner electrode 140 of the driving/detecting electrodes in the tuning-fork-type bimorph piezoelectric vibrator 100 is connected to a self-excited oscillation circuit 210, while the outer electrodes 142a and 142b of the driving/detecting electrodes in the tuning-fork-type bimorph piezoelectric vibrator 100 are connected via resistors R1 and R2 to ground, and are further connected to buffers 220a and 220b.

The outputs of the buffers 220a and 220b are connected to a cumulative circuit 230, from which an in-phase component of the two legs 122a and 122b is sent as feedback to the self-excited oscillation circuit 210. Thus, an electric field is applied to the two legs 122a and 122b in a direction substantially perpendicular to the polarization direction and produces fundamental vibrations, in which ends of the legs 122a and 122b vibrate towards and away from each other.

The outputs of the buffers 220a and 220b are also connected to a differential circuit 240, in which a difference between the two legs is detected. The output of the differential circuit 240 is supplied to a synchronous detector circuit 250 and is synchronous-detected at an oscillation frequency of the self-excited oscillation circuit 210. The resulting output is smoothed by a smoothing circuit 260 and amplified by a DC amplifier 270. Thus, a DC output 280 is extracted. If a rotational angular velocity about a rotation axis, which is the longitudinal direction of the two legs 122a and 122b of the tuning-fork-type bimorph piezoelectric vibrator 100, is zero, in-phase output signals are generated in the two outer electrodes 142a and 142b. In this case, there is no output from the differential circuit 240 and the DC output is zero.

If a rotational angular velocity ω about the rotation axis is applied, the Coriolis force is generated in a direction substantially perpendicular to the direction of vibrations in a non-rotating state, and the directions of vibrations of the two legs 122a and 122b are changed. Thus, opposite-phase signals corresponding to the Coriolis force are generated in the two outer electrodes 142a and 142b, and an alternating signal corresponding to the Coriolis force is generated as an output of the differential circuit 240. Then, the alternating signal is detected by the synchronous detector circuit 250 in synchronization with a driving frequency, smoothed by the smoothing circuit 260, and amplified by the DC amplifier 270. Thus, a direct-current component that is proportional to the rotational angular velocity ω is obtained.

Figure 3A:
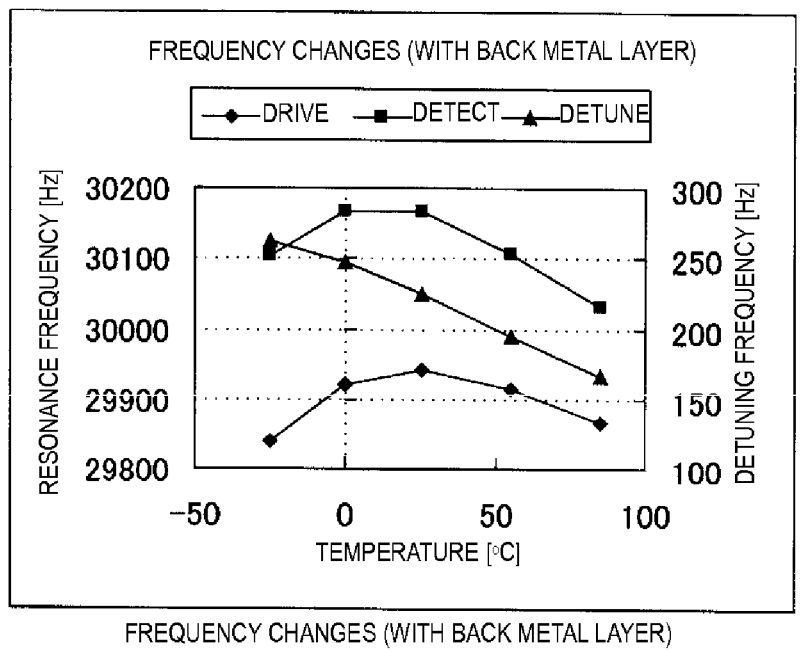
FIGS. 3A and 3B show a difference in the change in the detuning frequency with changes in temperature depending on whether a back metal layer is provided or not.
Figure 3B:
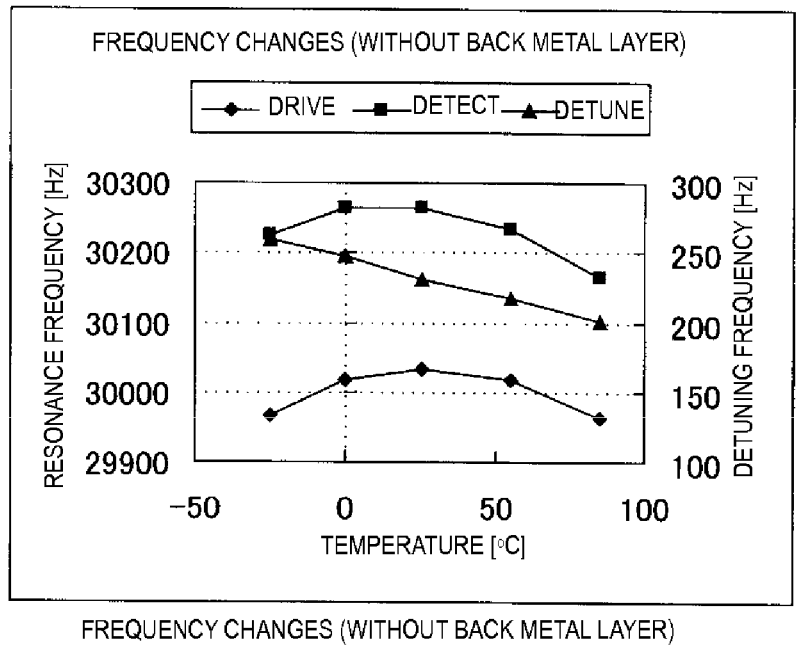

FIGS. 3A and 3B show the results of measurements taken to determine a difference in the change in detuning frequency with changes in temperature depending on whether or not a back metal layer is provided on the second principal surface of the tuning-fork-type bimorph piezoelectric vibrator. In FIGS. 3A and 3B, solid diamond symbols represent changes in resonance frequency of a driving system with changes in temperature, solid square symbols represent changes in resonance frequency of a detecting system with changes in temperature, and solid triangular symbols represent changes in detuning frequency, which is a difference between the resonance frequency of the driving system and that of the detecting system. FIG. 3A shows temperature characteristics when a back metal layer is provided, and FIG. 3B shows temperature characteristics when no back metal layer is provided.

As shown in FIG. 3A, when the temperature is changed from about −25° C. to about 85° C., for example, the detuning frequency is changed by about 98.5 KHz when a back metal layer is provided. However, referring to FIG. 3B, when the temperature is changed from about −25° C. to about 85° C., for example, when no back metal layer is provided, the amount of change in detuning frequency is reduced to about 58.0 KHz.

Figure 4A:
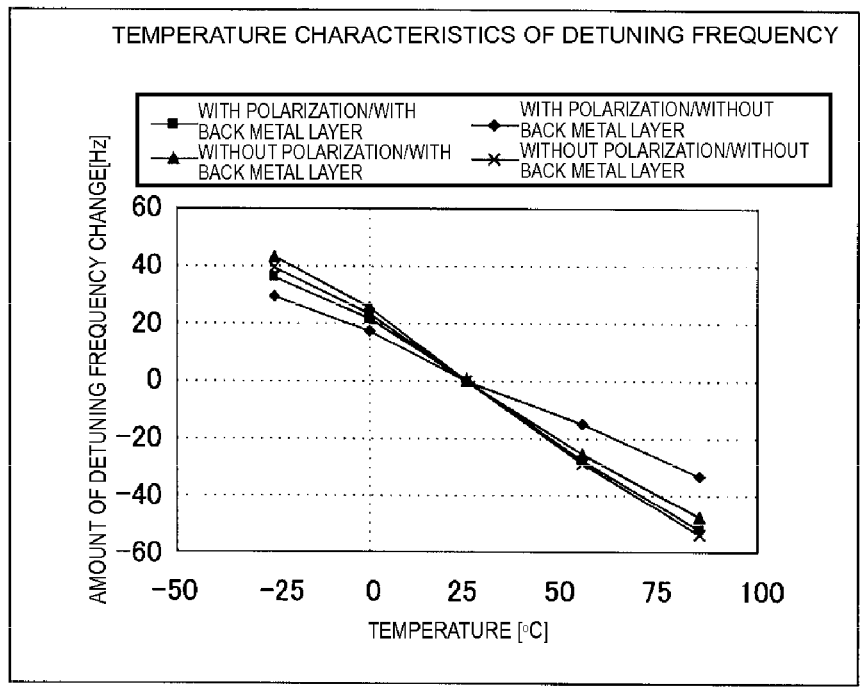
FIGS. 4A and 4B show differences in temperature characteristics of the detuning frequency depending on whether or not a back metal layer is provided and whether or not a back-side piezoelectric body is polarized.
Figure 4B:
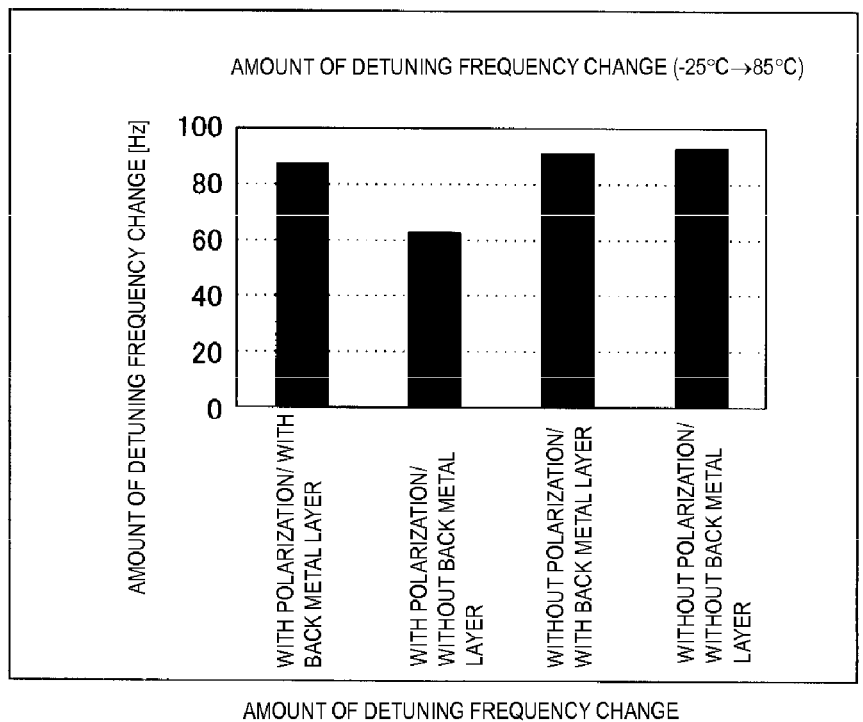

FIGS. 4A and 4B show the results of measurements taken to determine the differences in temperature characteristics of the detuning frequency depending on whether or not a back metal layer is provided on the second principal surface of the tuning-fork-type bimorph piezoelectric vibrator and whether or not the piezoelectric body on the back surface of the tuning-fork-type bimorph piezoelectric vibrator is polarized. FIG. 4A shows temperature characteristics of the detuning frequency. In FIG. 4A, solid square symbols represent a case in which the piezoelectric body on the back surface of the tuning-fork-type bimorph piezoelectric vibrator is polarized and in which a back metal layer is provided, solid diamond symbols represent a case in which the piezoelectric body on the back surface of the tuning-fork-type bimorph piezoelectric vibrator is polarized and in which a back metal layer is not provided, solid triangular symbols represent a case in which the piezoelectric body on the back surface of the tuning-fork-type bimorph piezoelectric vibrator is not polarized and in which a back metal layer is provided, and cross marks represent a case in which the piezoelectric body on the back surface of the tuning-fork-type bimorph piezoelectric vibrator is not polarized and in which a back metal layer is not provided. FIG. 4B shows the amount of change in detuning frequency measured, for each of the cases in FIG. 4A, when the temperature is changed from about −25° C. to about 85° C., for example.

As shown, in the case in which polarization is provided, temperature characteristics of the detuning frequency are greatly improved by not providing a back metal layer. However, in the case in which polarization not provided, the temperature characteristics are not significantly changed by the presence or absence of the back metal layer.

As described above, when the piezoelectric body on the back surface of the tuning-fork-type piezoelectric vibrator is polarized, temperature characteristics of the detuning frequency are changed depending on whether or not a back metal layer is provided. Therefore, it is likely that by not providing a back metal layer, the piezoelectric effect of the front-surface piezoelectric body and that of the back-surface piezoelectric body will be asymmetric, and variations in detuning frequency with changes in temperature are reduced by a reverse electric charge generated by the piezoelectric effect of the back-side piezoelectric body.

As described above, in the case in which polarization is provided, temperature characteristics of the detuning frequency are improved by not providing a back metal layer. Since it is likely that this improvement is achieved by reverse electric charge generated by the piezoelectric effect of the back-side piezoelectric body, there is no significant impact if a back metal layer is provided in an area at which substantially no electric charge is generated by the piezoelectric effect. In other words, it is likely that even if a back metal layer is provided in an area in which substantially no stress is applied during operation, improved temperature characteristics of the detuning frequency can be achieved.

Figure 5:
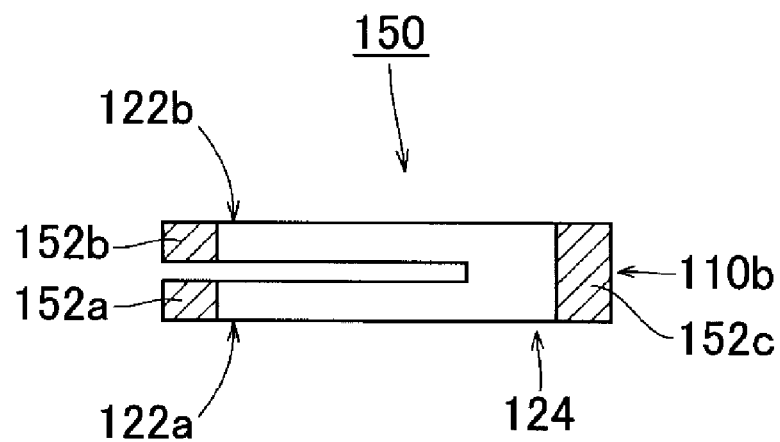
FIG. 5 schematically illustrates a tuning-fork-type bimorph piezoelectric vibrator in which a back metal layer is provided only in areas at which no more than a predetermined level of stress is applied during operation, according to another preferred embodiment of the present invention.

FIG. 5 schematically illustrates a structure of a second principal surface of a tuning-fork-type bimorph piezoelectric vibrator according to another preferred embodiment of the present invention. A tuning-fork-type bimorph piezoelectric vibrator 150 of this preferred embodiment is substantially the same as the tuning-fork-type bimorph piezoelectric vibrator 100 shown in FIGS. 1A to 1D, except that back metal layers 152a and 152b and a back metal layer 152c are provided on the second principal surface. The back metal layers 152a and 152b are located near ends surfaces of the legs 122a and 122b, and the back metal layer 152c is located near an end surface of the base 124.

Even if the second principal surface of the tuning-fork-type bimorph piezoelectric vibrator includes the back metal layers near the end surfaces of the legs and near the end surface of the base, substantially no stress is applied to the back metal layers and substantially no reverse electric charge is generated by the piezoelectric effect. Therefore, improved temperature characteristics of the detuning frequency can be provided.

In this preferred embodiment, the back metal layers are preferably arranged in both of an area near the end surfaces of the legs and an area near the end surface of the base. However, as long as a back metal layer is arranged only in an area in which no more than a predetermined level of stress is applied during operation, a back metal layer may be arranged only in one of the area near the end surfaces of the legs and the area near the end surface of the base.

Figure 6:
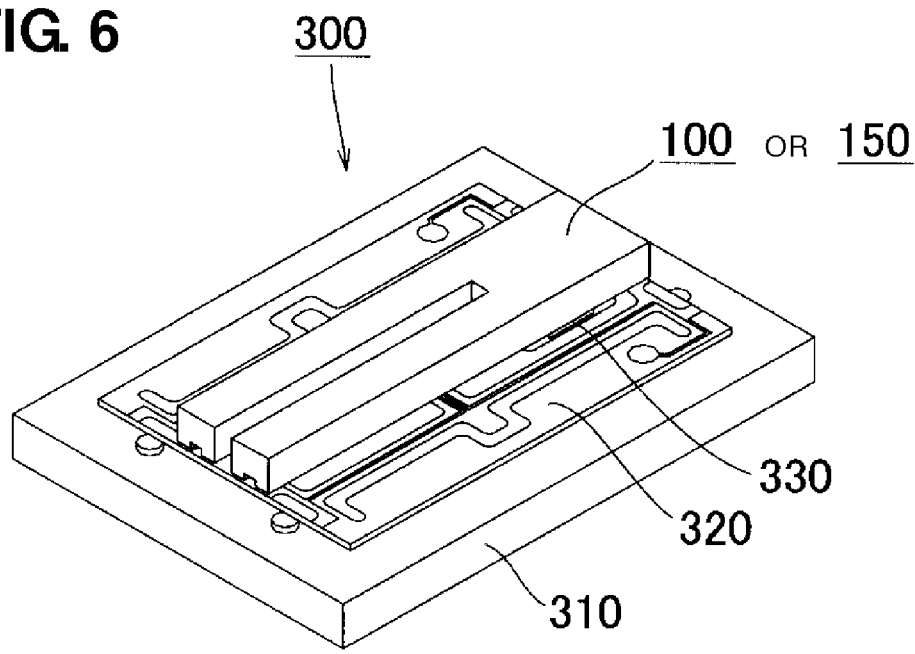
FIG. 6 schematically illustrates a vibrating gyroscope module according to a preferred embodiment of the present invention, the vibrating gyroscope module including a tuning-fork-type bimorph piezoelectric vibrator according to a preferred embodiment of the present invention.

FIG. 6 schematically illustrates a structure of a vibrating gyroscope module according to a preferred embodiment of the present invention, the vibrating gyroscope module including a tuning-fork-type bimorph piezoelectric vibrator of the present invention.

A vibrating gyroscope module according to another preferred embodiment of the present invention includes the tuning-fork-type bimorph piezoelectric vibrator 100 according to the first preferred embodiment of the present invention or the tuning-fork-type bimorph piezoelectric vibrator 150 according to the second preferred embodiment of the present invention to a supporting substrate 310.

The supporting substrate 310 preferably includes a circuit board 320 on which a driving/detecting circuit which drives the tuning-fork-type bimorph piezoelectric vibrator 100 or 150 to detect a rotational angular velocity is provided. A wiring electrode 330 connected to the driving/detecting circuit is located opposite to the base including the driving/detecting electrodes provided on the first principal surface of the tuning-fork-type bimorph piezoelectric vibrator 100 or 150.

The base including the driving/detecting electrodes provided on the first principal surface of the tuning-fork-type bimorph piezoelectric vibrator 100 or 150 is bonded to the wiring electrode 330 having a predetermined thickness using a conductive material, such as a conductive paste, for example. Thus, a vibration actuator of the tuning-fork-type bimorph piezoelectric vibrator 100 or 150 is supported so as to be spaced from the supporting substrate, and, at the same time, an electrical connection is established between the wiring electrode 330 on the supporting substrate and the driving/detecting electrodes 140, 142a, and 142b of the tuning-fork-type bimorph piezoelectric vibrator 100 or 150.

As described above, since the driving/detecting electrodes provided on the first principal surface and located in the base of the tuning-fork-type bimorph piezoelectric vibrator are bonded to the wiring electrode on the supporting substrate having a predetermined thickness using a conductive material, support for the tuning-fork-type bimorph piezoelectric vibrator and an electrical connection are both provided. Therefore, there is no need to provide a special support to secure the tuning-fork-type bimorph piezoelectric vibrator to the supporting substrate. In addition, there is no need to provide additional wires to establish an electrical connection with the wiring electrode after the tuning-fork-type bimorph piezoelectric vibrator is secured to the supporting substrate. Accordingly, the cost of manufacturing the vibrating gyroscope module including the tuning-fork-type bimorph piezoelectric vibrator according to preferred embodiments of the present invention is greatly reduced.

In this preferred embodiment, a conductive material having a predetermined thickness is preferably used to bond the driving/detecting electrodes provided on the first principal surface and located in the base of the tuning-fork-type bimorph piezoelectric vibrator to the wiring electrode on the supporting substrate, for example. However, the bonding may be provided using a conductive spacer, for example. Alternatively, the base of the tuning-fork-type bimorph piezoelectric vibrator or the supporting substrate may include a step, which allows the vibration actuator of the tuning-fork-type bimorph piezoelectric vibrator to be supported and spaced from the supporting substrate.

Additionally, in this preferred embodiment, the circuit board on which the driving/detecting circuit is provided is disposed on the supporting substrate. However, it will be understood that the driving/detecting circuit and the wiring electrode may, alternatively, be disposed directly on the supporting substrate.

Also, in this preferred embodiment, by bonding the driving/detecting electrodes arranged on the first principal surface and located in the base of the tuning-fork-type bimorph piezoelectric vibrator to the wiring electrode on the supporting substrate using a conductive material, support for the tuning-fork-type bimorph piezoelectric vibrator and an electrical connection are both provided. Alternatively, after the tuning-fork-type bimorph piezoelectric vibrator is attached to the supporting substrate, the driving/detecting electrodes on the tuning-fork-type bimorph piezoelectric vibrator may be wired in the wiring electrode on the supporting substrate to establish an electrical connection.

A method for manufacturing the tuning-fork-type bimorph piezoelectric vibrator 100 according to a preferred embodiment of the present invention will now be described.

First, the first piezoelectric body 110a polarized in the thickness direction and having a metal layer formed on the front surface thereof and the second piezoelectric body 110b polarized in a thickness direction and having a metal layer formed on a back surface thereof are prepared. Then, the first piezoelectric body and the second piezoelectric body are bonded together such that the polarization directions thereof are opposite to each other. Thus, a master substrate (not shown) having the intermediate metal layer 112 disposed between the bonding surfaces of the first and second piezoelectric bodies and a front metal layer arranged on the first principal surface (i.e., a surface of the first piezoelectric body) is produced.

Next, the resulting master substrate is cut at predetermined intervals to form cutout blocks (not shown).

Then, the first slits 120, extending in the longitudinal direction and partially dividing a cutout block into right and left substantially symmetrical portions in the width direction of each of the cutout blocks, are formed in the respective cutout blocks at predetermined intervals to define the tuning fork structure of the cutout block. Thus, the legs 122a and 122b of the tuning fork structure are formed in each of the cutout blocks.

Next, in the first principal surface of each cutout block in which the legs of the tuning fork structure are formed, the second slits 130a and 130b are formed along the longitudinal direction. Thus, the front metal layer formed on the first principal surface of each cutout block is divided into the driving/detecting electrodes 140, 142a, and 142b.

Finally, the cutout blocks, each having the driving/detecting electrodes provided thereon, are separated into individual tuning-fork-type bimorph piezoelectric vibrators 100 by cutting along lines, each line being located substantially at the center between adjacent first slits of the cutout blocks and being substantially parallel to the first slits.

As described above, in a manufacturing method according to this preferred embodiment of the present invention, a first piezoelectric body polarized in the thickness direction and having a metal layer arranged on the front side and a second piezoelectric body polarized in the thickness direction and having a metal layer arranged on the back side are bonded together such that their polarization directions are opposite to each other. Thus, a master substrate having a bimorph structure and in which an intermediate metal layer is disposed between the bonding surfaces of the first and second piezoelectric bodies and a front metal layer is arranged on the first principal surface is easily produced. From the master substrate, a plurality of tuning-fork-type bimorph piezoelectric vibrators, each having an intermediate metal layer disposed between the piezoelectric bodies, can be manufactured simultaneously.

Moreover, in the manufacturing method according to this preferred embodiment of the present invention, legs of a tuning fork structure are formed in each of the cutout blocks by providing first slits in the respective cutout blocks obtained from the master substrate, while driving/detecting electrodes are formed in each of the cutout blocks by providing second slits in the first principal surface. Then finally, the cutout blocks are separated by cutting along lines, each being located substantially at the center between adjacent first slits. As a result, tuning-fork-type bimorph piezoelectric vibrators, each having driving/detecting electrodes provided on the first principal surface and not having a metal layer provided on the second principal surface, can be manufactured without the need to individually form electrodes after back grinding. Thus, reliable tuning-fork-type bimorph piezoelectric vibrators can be efficiently manufactured at low cost.

In the preferred embodiment described above, a master substrate having a front metal layer and an intermediate metal layer is preferably produced by bonding a first piezoelectric body having a metal layer arranged on the front surface and a second piezoelectric body having a metal layer arranged on the back surface together, for example. Alternatively, a master substrate having a front metal layer and an intermediate metal layer may be produced by bonding a first piezoelectric body having metal layers arranged on both the front surface and the back surface and a second piezoelectric body having no metal layer together.

Next, a method for manufacturing the tuning-fork-type bimorph piezoelectric vibrator 150 according to another preferred embodiment of the present invention will be described.

First, the first piezoelectric body 110a polarized in a thickness direction and having a metal layer formed on the front surface and the back sides thereof and the second piezoelectric body 110b polarized in a thickness direction and having a metal layer formed on a back surface thereof are prepared. Then, the first piezoelectric body and the second piezoelectric body are bonded together such that the polarization directions thereof are opposite to each other. Thus, a master substrate (not shown) having the intermediate metal layer 112 disposed between the bonding surfaces of the first and second piezoelectric bodies, a front metal layer to be formed into driving/detecting electrodes and arranged on the first principal surface (i.e., a surface of the first piezoelectric body), and a back metal layer arranged on the second principal surface (i.e., a surface of the second piezoelectric body) is produced.

Next, a portion of the back metal layer is removed from the second principal surface of the resulting master substrate, the portion being subjected to greater than a predetermined level of stress during operation of the tuning-fork-type piezoelectric vibrator. This partial removal of the back metal layer may be performed by grinding, etching, or other suitable method.

Then, the resulting master substrate is cut at predetermined intervals to form cutout blocks (not shown).

Next, the first slits 120, each extending in the longitudinal direction of the cutout blocks and partially dividing a cutout block into right and left substantially symmetrical portions in the width direction of each of the cutout blocks, are formed in the respective cutout blocks at predetermined intervals to define the tuning fork structure. Thus, the legs 122a and 122b of the tuning fork structure are formed in each of the cutout blocks.

Additionally, in the first principal surface of each cutout block in which legs of a tuning fork structure are formed, the second slits 130a and 130b having a depth less than the thickness of the first piezoelectric body having the front metal layer are formed along the longitudinal direction. Thus, the front metal layer formed on the first principal surface of each cutout block is divided into the driving/detecting electrodes 140, 142a, and 142b.

Finally, the cutout blocks, each having a front metal layer defining driving/detecting electrodes, are separated into individual tuning-fork-type bimorph piezoelectric vibrators 150 by cutting along lines, each line being located substantially at the center between adjacent first slits 120 of the cutout blocks and being substantially parallel to the first slits 120.

As described above, in a manufacturing method according to another preferred embodiment of the present invention, a first piezoelectric body polarized in the thickness direction and having metal layers formed on the front surface and the back surface and a second piezoelectric body polarized in the thickness direction and having a metal layer formed on the back surface are bonded together such that the polarization directions thereof are opposite to each other. Thus, a master substrate having a bimorph structure and in which an intermediate metal layer is disposed between the bonding surfaces of the first and second piezoelectric bodies, a front metal layer is arranged on the first principal surface, and a back metal layer is arranged on the second principal surface can be easily produced. Additionally, a portion of the back metal layer is removed from the second principal surface of the resulting master substrate, the portion being subjected to greater than a predetermined level of stress during operation of the tuning-fork-type piezoelectric vibrator. Thus, from the master substrate, a plurality of tuning-fork-type bimorph piezoelectric vibrators, each having a back metal layer from which a portion to be subjected to greater than a predetermined level of stress during operation is removed, can be manufactured simultaneously.

Moreover, in the manufacturing method according to this preferred embodiment of the present invention, legs of a tuning fork structure are formed in each of the cutout blocks by providing first slits in the respective cutout blocks obtained from the master substrate, and driving/detecting electrodes are formed in each of the cutout blocks by providing second slits in the first principal surface. Then finally, the cutout blocks are separated by cutting along lines, each being located substantially at the center between adjacent first slits. As a result, tuning-fork-type bimorph piezoelectric vibrators, each having a second principal surface on which a back metal layer is formed in an area in which greater than a predetermined level of stress is not applied during operation, can be manufactured without having to individually form electrodes after back grinding. Thus, reliable tuning-fork-type bimorph piezoelectric vibrators can be efficiently manufactured at low cost.

In the three types of manufacturing methods described above, when piezoelectric bodies are polarized, electrodes may preferably be formed on both principal surfaces of each of the piezoelectric bodies. Then, unnecessary portions of the electrodes on both surfaces of each of the piezoelectric bodies may be removed either before or after bonding of the piezoelectric bodies. Also, as long as the front metal layer formed on the first principal surface of the master substrate is divided into the driving/detecting electrodes 140, 142a, and 142b, there is no need to form the second slits 130a and 130b in the piezoelectric body 110a.

Preferred embodiments of the present invention provide, at low cost, a stable and accurate tuning-fork-type bimorph piezoelectric vibrator in which temperature characteristics of a detuning frequency are greatly improved with a simple structure. For example, a tuning-fork-type bimorph piezoelectric vibrator according to preferred embodiments of the present invention can be included in a vibrating gyroscope arranged to prevent motion blur in digital still cameras and digital video cameras.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A tuning-fork-type bimorph piezoelectric vibrator comprising:
   at least two piezoelectric bodies having opposite polarization directions and being bonded together to define a tuning fork structure;
   driving/detecting electrodes provided on a first principal surface defined by a surface of one of the at least two piezoelectric bodies;
   an intermediate metal layer disposed between bonding surfaces of the at least two piezoelectric bodies; wherein
   no metal layer is provided on a second principal surface defined by a surface of the other of the at least two piezoelectric bodies bonded together; and
   the intermediate metal layer is a floating electrode that extends entirely over the bonding surfaces of the at least two piezoelectric bodies and that has a uniform potential at all portions of the intermediate metal layer.

2. The tuning-fork-type bimorph piezoelectric vibrator according to claim 1, wherein
   a first slit extending in a longitudinal direction of the at least two piezoelectric bodies is provided and partially divides the vibrator into right and left substantially symmetric portions in a width direction of the vibrator, to thereby define legs of the tuning fork structure; and
   second slits extending in the longitudinal direction of the at least two piezoelectric bodies are arranged to divide a metal layer disposed on the first principal surface into the driving/detecting electrodes.

3. A vibrating gyroscope module comprising the tuning-fork-type bimorph piezoelectric vibrator according to claim 1 arranged to detect a rotational angular velocity, the vibrating gyroscope module comprising:
   a supporting substrate including a driving/detecting circuit arranged to drive the tuning-fork-type bimorph piezoelectric vibrator to detect a rotational angular velocity and a wiring electrode arranged to be connected to the driving/detecting electrodes of the tuning-fork-type bimorph piezoelectric vibrator; and a support arranged to support a vibration actuator of the tuning-fork-type bimorph piezoelectric vibrator so as to be spaced away from the supporting substrate.

4. The vibrating gyroscope module according to claim 3, wherein the wiring electrode on the supporting substrate is disposed opposite the driving/detecting electrodes in the base of the tuning-fork-type bimorph piezoelectric vibrator.

5. The vibrating gyroscope module according to claim 4, wherein the support bonds the driving/detecting electrodes of the tuning-fork-type bimorph piezoelectric vibrator to the wiring electrode on the supporting substrate via a conductive material, to thereby support the vibration actuator of the tuning-fork-type bimorph piezoelectric vibrator so as to be spaced away from the supporting substrate and to provide an electrical connection between the driving/detecting electrodes and the wiring electrode.

6. A tuning-fork-type bimorph piezoelectric vibrator comprising:
   at least two piezoelectric bodies having opposite polarization directions and being bonded together to define a tuning fork structure;
   driving/detecting electrodes provided on a first principal surface defined by a surface of one of the at least two piezoelectric bodies;
   an intermediate metal layer disposed between bonding surfaces of the at least two piezoelectric bodies; and
   a back metal layer disposed on a second principal surface defined by a surface of the other of the at least two piezoelectric bodies only at least one of two longitudinal end portions of the at least two piezoelectric bodies, and not disposed at portions of the second principal surface disposed between the longitudinal end portions of the at least two piezoelectric bodies.

7. The tuning-fork-type bimorph piezoelectric vibrator according to claim 6, wherein the tuning fork structure includes legs and a base, the back metal layer is arranged on at least one of an end portion of the legs of the tuning fork structure or an end portion of the base of the tuning fork structure.

8. The tuning-fork-type bimorph piezoelectric vibrator according to claim 6, wherein
   a first slit extending in a longitudinal direction of the at least two piezoelectric bodies is provided and partially divides the vibrator into right and left substantially symmetric portions in a width direction of the vibrator, to thereby define legs of the tuning fork structure; and
   second slits extending in the longitudinal direction of the at least two piezoelectric bodies are arranged to divide a metal layer disposed on the first principal surface into the driving/detecting electrodes.

9. A vibrating gyroscope module comprising the tuning-fork-type bimorph piezoelectric vibrator according to claim 6 arranged to detect a rotational angular velocity, the vibrating gyroscope module comprising:
   a supporting substrate including a driving/detecting circuit arranged to drive the tuning-fork-type bimorph piezoelectric vibrator to detect a rotational angular velocity and a wiring electrode arranged to be connected to the driving/detecting electrodes of the tuning-fork-type bimorph piezoelectric vibrator; and
   a support arranged to support a vibration actuator of the tuning-fork-type bimorph piezoelectric vibrator so as to be spaced away from the supporting substrate.

10. The vibrating gyroscope module according to claim 9, wherein the wiring electrode on the supporting substrate is disposed opposite to the driving/detecting electrodes in the base of the tuning-fork-type bimorph piezoelectric vibrator.

11. The vibrating gyroscope module according to claim 10, wherein the support bonds the driving/detecting electrodes of the tuning-fork-type bimorph piezoelectric vibrator to the wiring electrode on the supporting substrate via a conductive material, to thereby support the vibration actuator of the tuning-fork-type bimorph piezoelectric vibrator so as to be spaced from the supporting substrate and to provide an electrical connection between the driving/detecting electrodes and the wiring electrode.

* * * * *